United States Patent
Reill

(10) Patent No.: US 11,245,246 B2
(45) Date of Patent: Feb. 8, 2022

(54) SEMICONDUCTOR LASER DIODE

(71) Applicant: OSRAM OLED GmbH, Regensburg (DE)

(72) Inventor: Wolfgang Reill, Pentling (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/308,985

(22) PCT Filed: May 31, 2017

(86) PCT No.: PCT/EP2017/063208
§ 371 (c)(1),
(2) Date: Dec. 11, 2018

(87) PCT Pub. No.: WO2017/215919
PCT Pub. Date: Dec. 21, 2017

(65) Prior Publication Data
US 2019/0312406 A1 Oct. 10, 2019

(30) Foreign Application Priority Data

Jun. 13, 2016 (DE) ..................... 10 2016 110 790.5

(51) Int. Cl.
*H01S 5/042* (2006.01)
*H01S 5/0237* (2021.01)
(Continued)

(52) U.S. Cl.
CPC ............ *H01S 5/0237* (2021.01); *H01S 5/023* (2021.01); *H01S 5/0233* (2021.01);
(Continued)

(58) Field of Classification Search
CPC .... H01S 5/0425; H01S 5/04254; H01S 5/024; H01S 5/02469; H01S 5/02476;
(Continued)

(56) References Cited

U.S. PATENT DOCUMENTS 5,394,012 A 2/1995 Kimura
6,104,738 A 8/2000 Kitoh et al.
(Continued)

FOREIGN PATENT DOCUMENTS

CN 1398030 A 2/2003
CN 1957510 A 5/2007
(Continued)

OTHER PUBLICATIONS

Sautter, D. et al. Lexicon Electronic und Microelectronic, *VDI-Verlag GmbH*, 1993, pp. 412-414, and an English translation.
(Continued)

*Primary Examiner* — Tod T Van Roy
(74) *Attorney, Agent, or Firm* — DLA Piper LLP (US)

(57) ABSTRACT

A semiconductor laser diode includes a semiconductor body having an emitter region; and a first connection element that electrically contacts the semiconductor body in the emitter region, wherein the semiconductor body is in contact with the first connection element in the emitter region, and at least in places in the emitter region, the semiconductor body has a structuring that enlarges a contact area between the semiconductor body and the first connection element.

13 Claims, 6 Drawing Sheets

(51) Int. Cl.
*H01S 5/065* (2006.01)
*H01S 5/023* (2021.01)
*H01S 5/0233* (2021.01)
*H01S 5/0234* (2021.01)
*H01S 5/0235* (2021.01)
*H01S 5/024* (2006.01)

(52) U.S. Cl.
CPC .......... *H01S 5/0234* (2021.01); *H01S 5/0235* (2021.01); *H01S 5/04254* (2019.08); *H01S 5/0653* (2013.01); *H01S 5/02461* (2013.01); *H01S 5/02469* (2013.01); *H01S 2301/176* (2013.01)

(58) Field of Classification Search
CPC ............... H01S 5/02492; H01S 5/0651; H01S 5/0653–0655
See application file for complete search history.

(56) References Cited

U.S. PATENT DOCUMENTS

| | | | |
|---|---|---|---|
| 7,529,279 B2* | 5/2009 | Reid | H01S 5/06256 372/102 |
| 7,560,351 B2 | 6/2009 | Hofmann et al. | |
| 7,763,907 B2* | 7/2010 | Tachibana | H01L 33/02 257/103 |
| 9,018,641 B2 | 4/2015 | Brick et al. | |
| 9,331,453 B2 | 5/2016 | Strauss et al. | |
| 2003/0012521 A1 | 1/2003 | Yokoyama et al. | |
| 2005/0201437 A1* | 9/2005 | Reid | H01S 5/12 372/43.01 |
| 2006/0258027 A1 | 11/2006 | Ohmae et al. | |
| 2007/0133648 A1* | 6/2007 | Matsuda | H01S 5/12 372/102 |
| 2008/0273562 A1* | 11/2008 | Hasegawa | B82Y 20/00 372/44.01 |
| 2010/0183041 A1 | 7/2010 | Imanishi | |
| 2010/0284434 A1 | 11/2010 | Koenig et al. | |
| 2011/0051771 A1* | 3/2011 | Avramescu | H01L 33/0075 372/50.1 |
| 2011/0243169 A1* | 10/2011 | Lauer | H01S 5/0425 372/45.01 |
| 2011/0263128 A1* | 10/2011 | Duncan | H01L 21/30612 438/745 |
| 2013/0272333 A1 | 10/2013 | Strauss et al. | |
| 2014/0334508 A1* | 11/2014 | Lauer | H01S 5/024 372/36 |
| 2014/0362883 A1* | 12/2014 | Lell | H01S 5/2036 372/36 |
| 2015/0129901 A1 | 5/2015 | Höppel et al. | |
| 2016/0315446 A1 | 10/2016 | Taeger et al. | |
| 2017/0310081 A1 | 10/2017 | Lauer et al. | |
| 2018/0331502 A1 | 11/2018 | Bachmann et al. | |

FOREIGN PATENT DOCUMENTS

| | | | |
|---|---|---|---|
| CN | 104247172 A | 12/2014 | |
| DE | 29 29 939 | 2/1981 | |
| DE | 43 36 003 | 4/1994 | |
| DE | 10 2007 061 458 | 6/2009 | |
| DE | 10 2015 119 226 | 5/2017 | |
| JP | 4-101482 A | 4/1992 | |
| JP | 2002-0169312 | * 1/2002 | ............ H01S 5/042 |
| JP | 2002-299769 A | 10/2002 | |
| JP | 2003-179295 A | 6/2003 | |
| JP | 2008-71945 A | 3/2008 | |
| JP | 2008-532279 A | 8/2008 | |
| JP | 2011-508440 A | 3/2011 | |
| JP | 2014-72495 A | 4/2014 | |
| JP | 2015-41688 A | 3/2015 | |
| KR | 10-2011-0096989 A | 8/2011 | |
| WO | 97/24787 A1 | 7/1997 | |
| WO | 2005/006429 | 1/2005 | |
| WO | 2006/090990 A1 | 8/2006 | |
| WO | 2013/079346 | 6/2013 | |
| WO | 2014/012760 | 1/2014 | |
| WO | 2015/091060 | 6/2015 | |

OTHER PUBLICATIONS

Crump, P. et al.: "Experimental and Theoretical Analysis of the Dominant Lateral Waveguiding Mechanism in 975 nm High Power Broad Area Diode Lasers," *Semiconductor Science and Technology*, Feb. 16, 2012, vol. 27, 045001 pp. 1-9.

The First Office Action dated Feb. 3, 2020, of counterpart Chinese Application No. 201780036897.5, along with an English translation.

Notification of Reasons for Refusal dated Dec. 11, 2019, of counterpart Japanese Application No. 2018-565031, along with an English translation.

O'Callaghan, J.R et al., Spatial coherence and thermal lensing in broad-area semiconductor lasers, *IEEE Journal of Quantum Electronics, IEEE*, Jan. 30, 2004, vol. 40, No. 1, pp. 1-9.

Notice of Allowance dated Oct. 12, 2020, of counterpart Chinese Application No. 201780036897.5, along with an English translation.

Supplemental Search dated Sep. 24, 2020, of counterpart Chinese Application No. 201780036897.5.

* cited by examiner

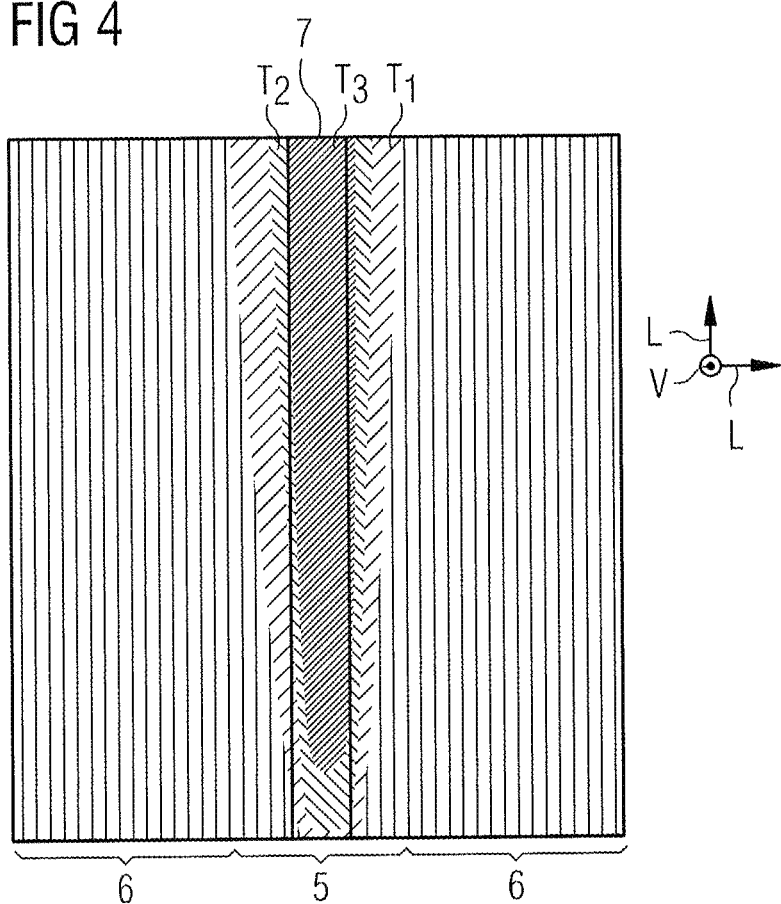

SEMICONDUCTOR LASER DIODE

TECHNICAL FIELD

This disclosure relates to a semiconductor laser diode.

BACKGROUND

WO 2013/079346 A1 describes a semiconductor laser diode. There is nonetheless a need to provide a semiconductor laser diode that can be used to generate laser radiation having reduced beam divergence and a semiconductor laser diode by which laser radiation can be generated particularly efficiently.

SUMMARY

I provide a semiconductor laser diode including a semiconductor body having an emitter region; and a first connection element that electrically contacts the semiconductor body in the emitter region, wherein the semiconductor body is in contact with the first connection element in the emitter region, and at least in places in the emitter region, the semiconductor body has a structuring that enlarges a contact area between the semiconductor body and the first connection element.

BRIEF DESCRIPTION OF THE DRAWINGS

FIG. 4 shows a schematic representation of an example of a semiconductor laser diode.

Figure 1:
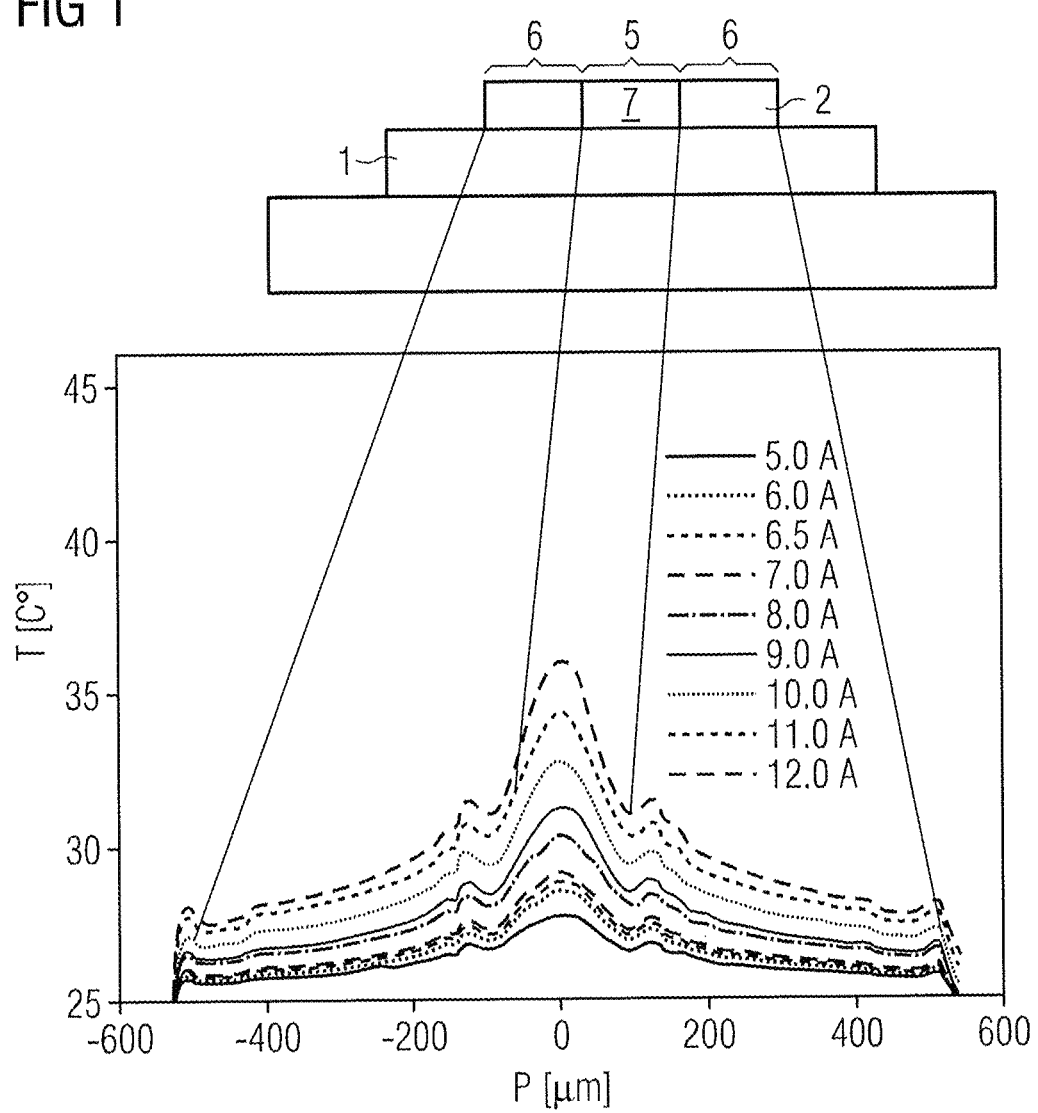
FIG. 1 illustrates in detail a problem that is solved by my semiconductor laser diodes.

LIST OF REFERENCE SIGNS 1 carrier
2 semiconductor body
21 n-conductive region
22 p-conductive region
23 active region
24 connection region
26 structuring
26a structure
27 further structuring
27a further structures
28 contact area
3 first connection element
4 second connection element
41 contact point
42 contact wire
5 emitter region
6 subregion
7 radiation exit surface
8 insulation element
T1, T2, T3 temperatures
d distance
D diameter

DETAILED DESCRIPTION

My semiconductor laser diode may comprise a semiconductor body having an emitter region.

The semiconductor body of the semiconductor laser diode is formed, for example, from a III-V compound semiconductor material or from a II-VI compound semiconductor material. For example, the semiconductor body can be epitaxially grown on a substrate.

Laser radiation is generated in the emitter region of the semiconductor body during operation of the semiconductor laser diode. For example, the emitter region extends over a main part of the length of the semiconductor laser diode and includes an active region of the semiconductor body. The active region includes, for example, a pn-junction, a double hetero-structure, a single quantum well structure and/or a multiple quantum well structure. The semiconductor laser diode can have one or several emitter regions. In particular, it is possible for the semiconductor laser diode to have two or more emitter regions, for example, exactly five emitter regions spaced apart in a lateral direction perpendicular to the main extension direction of the emitter regions and arranged parallel to each other. The lateral directions are those directions running parallel to a main extension plane of the semiconductor laser diode and the semiconductor body.

Within the emitter region, the semiconductor body may be formed to be thicker in a vertical direction perpendicular to the lateral directions than outside the emitter region. The emitter region, for example, is then formed as a bar-shaped structure of the semiconductor body. In particular, in the emitter region, it is possible that the semiconductor body is electrically conductively contacted on one side, for example, on its p-conducting side, whereas on the same side, it is not electrically conductively contacted outside the emitter region.

The semiconductor laser diode may comprise a first connection element that electrically contacts the semiconductor body in the emitter region. For example, the first connection element is a metallic layer or a metallic layer sequence that can, for example, directly or indirectly adjoin the semiconductor body in the emitter region. The first connection element can cover a main part or all of a main surface of the semiconductor body, wherein an electrical contact is present between the first connection element and the emitter region, in particular exclusively in the emitter region.

In the emitter region, the semiconductor body may be in contact with the first connection element. In particular, it is possible for the semiconductor body to be in direct contact with the first connection element in the emitter region. It is also possible that the semiconductor body is in direct contact with the first connection element only in the emitter region and there is no direct contact between the semiconductor body and the connection element outside the emitter region.

At least in places in the emitter region, the semiconductor body may have a structuring that enlarges a contact area between the semiconductor body and the first connection element. In other words, in the emitter region on its side facing towards the first connection element, the semiconductor body is not planar and not flat, but has a structuring so that a contact area in which the semiconductor body and the first connection element are in contact with one another is enlarged compared to an unstructured semiconductor body. The structuring can comprise a plurality of structures formed, for example, by elevations and/or depressions in the semiconductor body.

A semiconductor laser diode may be provided with a semiconductor body comprising an emitter region, and a first connection element that electrically contacts the semiconductor body in the emitter region, wherein in the emitter region, the semiconductor body is in contact with the first connection element, and at least in places in the emitter region, the semiconductor body has a structuring that enlarges a contact area between the semiconductor body and the first connection element.

During operation of the semiconductor laser diode, laser radiation having a wavelength of at least 970 nm, for example, of 975 nm or 980 nm, is generated in the emitter region. The semiconductor body of the semiconductor laser diode is based, for example, on an InGaAs material system. The semiconductor laser, however, can also be a semiconductor laser that generates electromagnetic radiation in the spectral range from UV radiation to infrared radiation and is based on a correspondingly suitable material system, in particular on a III-V compound semiconductor material.

The theory behind the semiconductor laser described here are inter alia the following: One reason for high beam divergences of the electromagnetic radiation generated by a semiconductor laser during operation is self-focusing within a resonator of the semiconductor laser. This self-focusing results from formation of a thermal lens. The wave-front of the generated electromagnetic radiation is deformed as it passes through an area with inhomogeneous temperature distribution. In particular, towards a light exit surface, the semiconductor laser diode heats up at a higher rate compared to a side of the resonator of the semiconductor laser diode facing away from the light exit side and comprises for instance a highly reflective mirror facet. Due to the temperature dependence of the refractive index of the semiconductor material of the semiconductor body and the optical gain of the semiconductor material of the semiconductor body, the thermal lens is formed and reduces the optical gain of the semiconductor laser diode. Furthermore, the beam divergence of the generated laser radiation increases, resulting in a particular disadvantage regarding coupling the laser radiation into a glass fiber, for example.

The semiconductor laser diode is based, inter alia, on the knowledge that an enlargement in the contact area between the semiconductor body and the first connection element improves heat dissipation from the semiconductor laser diode during operation, since in this way the area is enlarged through which heat is dissipated from the semiconductor laser diode. This can be achieved by introducing a structuring of the semiconductor body in the emitter region without changing the geometries determining the semiconductor laser diode such as resonator length and width. Due to the structuring, at least in the emitter region, the semiconductor laser diode is cooled more efficiently compared to an unstructured semiconductor body and, during operation, the temperature of the semiconductor laser diode can be lowered especially in the region in which the thermal lens mentioned above occurs.

At least in places, the contact area with the structuring between the semiconductor body and the first connection element may be at least 1.5 times as large as a contact area without any structuring between the semiconductor body and the connection element. In other words, in addition to their base area, the structures used to form the structuring have a lateral surface that enlarges the contact area accordingly. If, for example, the structure is a truncated cone, depending on the height of the truncated cone, it is possible to double the base area so that approximately twice the amount of heat per unit area can be dissipated.

The connection element may comprise a metallic layer that completely covers the semiconductor body in the emitter region. For example, it is possible that the connection element contains the metallic layer or consists of the metallic layer. The metallic layer can, for example, be formed by a metal that conducts heat well such as gold, or it can consist of this metal. The metallic layer can be applied onto the semiconductor body in particular by sputtering or vapor deposition and in this way completely wet the structures of the structuring so that a contiguous metallic layer is formed on the contact area.

The structuring may comprise at least in places at least one of the following structures: truncated cone, inverse truncated cone, truncated pyramid, inverse truncated pyramid, cone, inverse cone, pyramid, inverse pyramid, spherical shell, inverse spherical shell. This means that the structures can be formed as elevations or depressions in the semiconductor body. Within the manufacturing tolerances, the structures are given or at least approximated by the geometric bodies mentioned above. This means that, with regard to manufacturing tolerances, the structures can deviate from the perfect geometric shape. Furthermore, the structures can have any base area. For example, it is possible for the structures being formed as pyramids, inverse pyramids, truncated pyramids or inverse truncated pyramids to have an n-angular base, where n is $\geq 3$.

A maximum lateral extension of the structure may be at least 400 nm. The maximum lateral extension is the maximum diameter of the structures, for example, at their base. The maximum lateral extension is preferably at least 400 nm for a large part of the structures, i.e. for at least 50 percent, in particular for at least 75 percent, of the structures. Such a maximum lateral extension has proven to be advantageous to enlarge the contact area between the semiconductor body and the first connection element since such large structures make it possible to enlarge the contact area particularly significantly.

The structuring may have a density of structures, wherein the density of the structures increases towards a radiation exit surface of the semiconductor laser diode.

In the region of the radiation exit surface, the semiconductor laser diode has the area in which the temperature of the semiconductor body becomes greatest during operation. To counteract the effect of the thermal lens, it is advantageous to apply as many structures of the structuring as possible in the areas of high temperature and thus carry out the structuring there in a particularly high density. In particular, the density of the structuring can be chosen to follow a temperature profile of the emitter region without structuring during operation of the semiconductor laser. This means that the higher the temperature in a semiconductor laser diode of the same construction without structuring at a certain location in the emitter region, the higher the density of the structures of the structuring is selected at this location.

For example, the density can be adjusted by selecting the distance between adjacent structures and selecting the size of the structures.

The closer the structures are to the radiation exit surface, the smaller the distance may be between the adjacent structures. Keeping the same size of the structures, the density of the structures can be adjusted by the distance between adjacent structures. The closer the structures are to the radiation exit surface, the smaller the distance is chosen so that the distance between adjacent structures is chosen to be particularly small in such areas where a semiconductor laser diode, which is the same construction but is free of the structuring, has a particularly high temperature. In this way, the density of the structures is increased in these areas compared to other areas.

In the emitter region, the semiconductor body may comprise a connection region that directly adjoins the first connection element at the contact area, wherein the connection region is not completely penetrated at any point. The connection region of the semiconductor body, for example, is a particularly highly doped layer of the semiconductor body. For example, the connection layer is a highly p-doped layer. The dopant concentration can be at least $5*10^{18}/cm^3$, especially at least $10^{19}/cm^3$. This layer can also be referred to as the final or cap layer.

In the vertical direction, the connection region can project beyond the areas of the semiconductor body that do not belong to the emitter region. This means that the semiconductor body is thicker in the connection region than in neighboring regions, wherein the increased thickness is due to the semiconductor layer in the connection region.

The structuring is located in the connection region, wherein the structures are formed such that the connection region is not completely pierced at any point. In other words, the structuring partially reduces the thickness of the connection region. At no point, however, does it comprise a hole extending through the connection region. This ensures that the first connection element in the emitter region can completely adjoin the connection region of the semiconductor body and does not pierce the connection region of the semiconductor body.

This ensures that the first connection element adjoins a region of the semiconductor body having a particularly low ohmic resistance due to its high doping.

The semiconductor body may comprise a subregion disposed laterally adjacent to the emitter region. In particular, the semiconductor body in the subregion has at least in places a further structuring comprising further structures, wherein the further structuring is configured to weaken secondary modes.

In the subregion, the semiconductor body is preferably not electrically contacted by the first connection element. For example, in the subregion, an electrically insulating insulation element is located between the semiconductor body and the first connection element and/or the first connection element is formed only in the emitter region. The semiconductor laser diode can cover many of the subregions. For example, if the semiconductor laser diode comprises a single emitter region, the subregions can be arranged on both sides of a longitudinal axis of the emitter region so that in this case the semiconductor laser diode comprises two subregions. If the semiconductor laser diode comprises two or more emitter regions, the subregions can be arranged in particular between the emitter regions. The semiconductor body then consists, for example, of subregions and emitter regions.

In the subregion, according to this example, the semiconductor body exhibits a further structuring configured to weaken the secondary modes, for example, by scattering electromagnetic radiation and/or absorbing electromagnetic radiation at the further structures of the further structuring. The weakening can be so strong that oscillation of the secondary modes is suppressed.

The further structuring can also contribute to improved heat dissipation of the semiconductor body during operation of the semiconductor laser diode.

An electrically insulating insulation element that completely covers the semiconductor body in the subregion on its side facing the first connection element may be arranged between the subregion and the first connection element. The insulation element is, for example, a layer or a sequence of layers formed from electrically insulating material.

For example, the insulation element is a layer of silicon dioxide or a layer of silicon nitride. Due to the electrical insulation of the subregion by the insulation element, it is possible to form the first connection element over a large area so that it can cover the semiconductor body in the emitter region and in the subregion. In this way it is possible that in extreme cases the semiconductor body is completely covered by the first connection element on its entire side facing the first connection element. By using a first connection element having high thermal conductivity, it is possible to dissipate heat from the semiconductor body in a particularly effective manner during operation of the semiconductor laser diode.

The structures of the structuring may have an average height that is smaller than an average height of the further structures of the further structuring. In other words, the structuring in the emitter region may have lower structures than the further structuring in the subregion. The height can be measured along the vertical direction.

In the event that the connection region of the semiconductor body also extends into the subregion, it is particularly possible that the further structuring has further structures that completely pierce the connection region. This is possible in the subregion since an electrical connection of the semiconductor body is not wanted there anyway.

In this way, the further structures having a greater height protrude further into the semiconductor body resulting in an improvement of their effect in reducing secondary modes.

The structures and/or the further structures may be produced by etching. This means that the structuring and/or the further structuring are produced by an etching process. The etching process can be dry chemical or wet chemical etching, for example. For example, the structures as well as the further structures can be produced photolithographically by a stepper or so-called natural lithography. The feature wherein the structures and/or the further structures are produced by etching is in particular a physical feature that can be verifiable at the finished product. For example, conventional analysis methods in semiconductor technology such as microscopic or electron microscopic tests can be used to determine whether a structure has been produced by etching or by an alternative manufacturing process. The etching is thus clearly verifiable at the finished product.

In the following, the semiconductor laser diodes described here will be explained in more detail using examples and the corresponding figures.

Identical, equivalent or equivalently acting elements are indicated with the same reference numerals in the figures. The figures and the proportions of the elements depicted in the figures shall not be considered to be true to scale unless units are expressly indicated. Individual elements can rather be illustrated exaggeratedly large for the purpose of better representability and/or better clarification.

FIG. 1 shows a schematic view of a conventional semiconductor laser diode. The semiconductor laser diode comprises a carrier 1 to which the semiconductor body 2 is applied. The semiconductor body 2 has a central emitter region 5 as well as two subregions 6 surrounding and adjoining the emitter region 5 on both sides. In the emitter region 5, the semiconductor laser diode has its radiation exit surface 7.

A thermal camera is directed at the radiation exit surface 7 to investigate the temperature behavior. The graphic application in FIG. 1 shows the temperature T depending on the position P on the side surface of the semiconductor body 2 facing the thermal camera for different operating currents with which the semiconductor laser diode is operated. It can be seen that at the radiation exit surface 7, the temperature in the emitter region 5 rises strongly with increasing operating current. This results in formation of a thermal lens as described, which reduces the efficiency and beam quality of the laser radiation generated by the semiconductor laser diode during operation.

Figure 2:
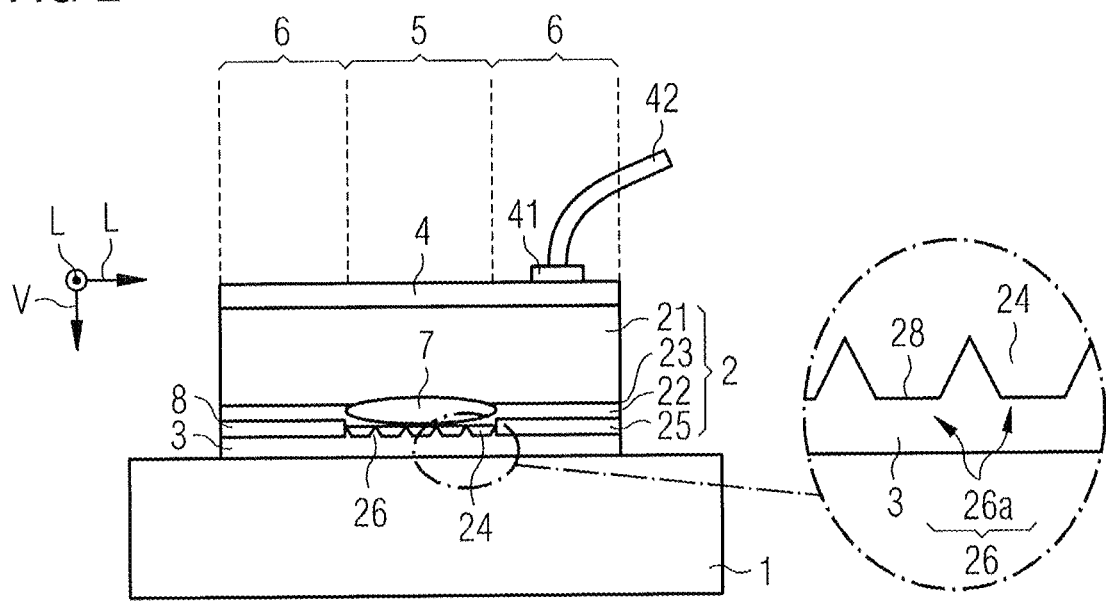
FIGS. 2 and 3 show schematic sectional views of examples of semiconductor laser diodes.

In connection with the schematic sectional view of FIG. 2, a first example of a semiconductor laser diode is explained in more detail. The semiconductor laser diode comprises a carrier 1. The carrier 1 can, for example, be a heat sink configured for the active or passive cooling of a semiconductor body 2 of the semiconductor laser diode.

The semiconductor body 2 of the semiconductor laser diode comprises an n-conductive region 21, a p-conductive region 22 and an active region 23 between the n-conductive region 21 and the p-conductive region 22. During operation of the semiconductor laser diode, electromagnetic radiation is generated and amplified in the active region.

The semiconductor body is divided into a central emitter region 5 surrounded on both sides by subregions 6. The semiconductor body is electrically connected on the p-side only in the emitter region 5. For this purpose, the semiconductor body comprises a connection region 24 formed in the emitter region 5 and which, for example, is formed with a highly p-doped semiconductor material. In this case, the connection region 24 projects above the remaining semiconductor body 2 along a strip in a vertical direction V perpendicular to the lateral directions L running parallel to the main extension plane of the semiconductor body.

The semiconductor laser diode also has a radiation exit surface 7 located on an outer facet of the semiconductor body in the region of the active region 23 within the emitter region 5.

The semiconductor body 2 is electrically conductively connected on the p-side via the first connection element 3. The first connection element 3, for example, is formed by a metal layer produced by sputtering or evaporation. In the connection region 24, the connection element 3 is in direct contact with the semiconductor body 2. In the subregions 6, each respective insulation element 8, formed for instance from an electrically insulating material such as silicon nitride, is arranged between the semiconductor body 2 and the first connection element 3.

In the emitter region 5 on its side facing the first connection element 3, the semiconductor body 2 now has a structuring 26 comprising a plurality of structures 26a. Compared to a flat and plane version of the connection region 24, the structuring 26 results in an enlargement of a contact area 28 between the semiconductor body 2 and the first connection element 3. The connection region 24 is not completely pierced by the first connection element 3, as the structures 26a do not extend throughout the connection region 24.

The connection element 3 can, for example, be thermally and electrically connected to the carrier 1 by a solder material.

On the side facing away from the first connection element 3, the semiconductor body 2 has a second connection element 4, via which the semiconductor body is contacted on the n-side. The second connection element 4 comprises for instance a contact point 41, which can be a bond pad electrically connected to a contact wire 42.

Both the first connection element 3 and the second connection element 4 completely cover the two main surfaces, i.e. the bottom surface and the top surface, of the semiconductor body 2. This enables a particularly good thermal bonding of the semiconductor body 2 to the carrier 1. Due to the structuring 26, the thermal bonding in the emitter region 5 is particularly good, resulting in suppression of formation of the thermal lens.

Figure 3:
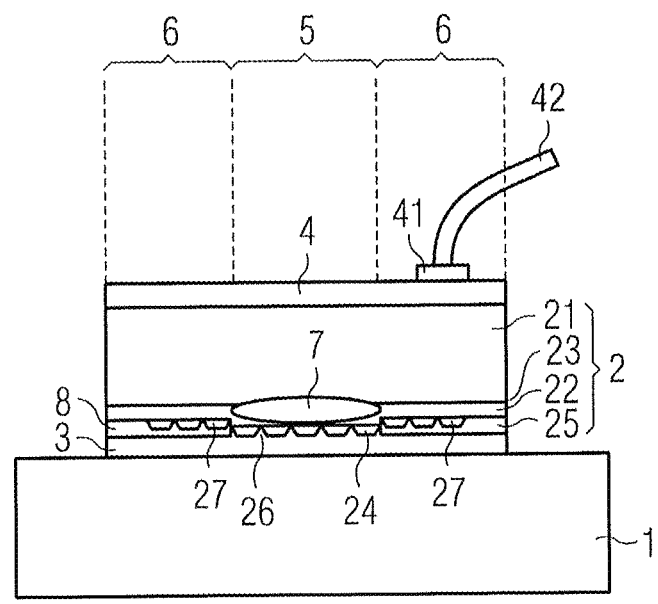

In connection with FIG. 3, a further example of a semiconductor laser diode described here is illustrated in more detail in a schematic sectional view. In addition to the example in FIG. 2, the semiconductor laser diode in FIG. 3 also has a further structuring 27 of the semiconductor body 2 in the subregions 6. The further structuring 27 comprises structures 27a. The further structuring 27 extends deeper into the semiconductor body than the structuring 26. The further structuring 27, however, does not cut through the active layer 23.

On its side facing the first connection element 3, the further structuring 27 is covered by the insulation 8 and in this way, the subregions 6 are not electrically connected.

The schematic illustration of FIG. 4 shows a top view of an example of my semiconductor laser diode. The semiconductor laser diode comprises a central emitter region 5 extending in the form of a bar and being surrounded on both sides by the subregions 6. The schematic illustration of FIG. 4 shows regions of different temperatures T1, T2, T3. The temperature T2 is greater than the temperature T1, and the temperature T3 is greater than the temperature T2.

Thus, FIG. 4 shows that the temperature is highest in the region of the radiation exit surface 7 and thus the thermal lens effect is most pronounced there. To counteract this, the higher the temperature of a semiconductor laser diode is without the structuring 26, the denser the structuring 26 can be formed in the emitter region 5. This means that the smaller the distance is from the radiation exit surface 7, the denser the structures 26a of the structuring 26 can be arranged and the smaller their distance d from each other is chosen. The temperature profile of the emitter region 5 resembles a parabola, wherein the structuring 26 can be controlled according to this shape.

In connection with the schematic representations of FIGS. 5A to 5D, different examples of formation of the structuring 26 are shown. The structures 27a of the further structuring 27 can be formed in the same or a similar way.

Figure 5A:
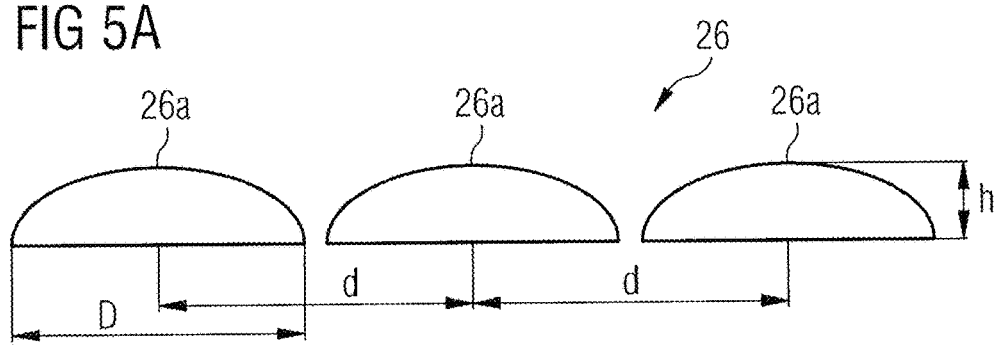
FIGS. 5A, 5B, 5C and 5D illustrate schematic representations of the structurings occurring in the examples of the semiconductor laser diodes.
Figure 5B:
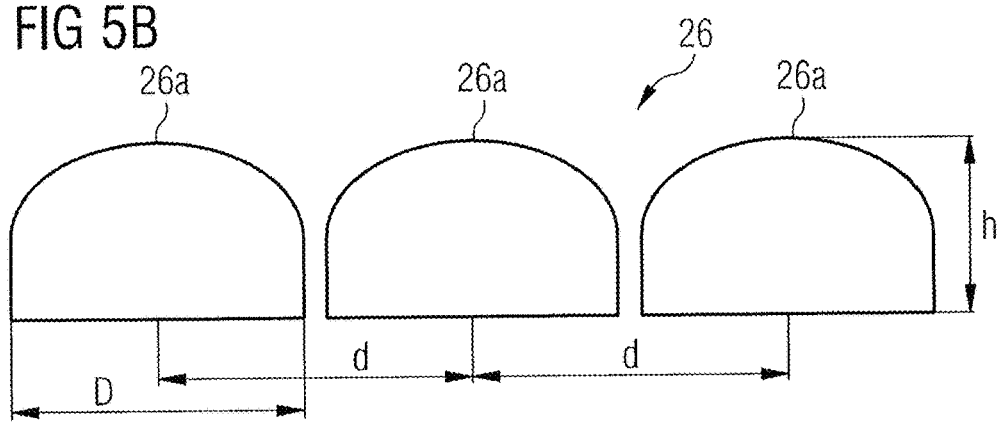

FIGS. 5A and 5B show the forms of the structures 26a and 27a as spherical shells, wherein in connection with FIG. 5B, the height h of the structures is chosen to be larger. The structures 26a and 27a each have a distance d from each other. As an alternative to the spherical shells, the structures can also be formed as inverse spherical shells, which are arranged in the semiconductor body 2 as depressions or recesses.

Figure 5C:
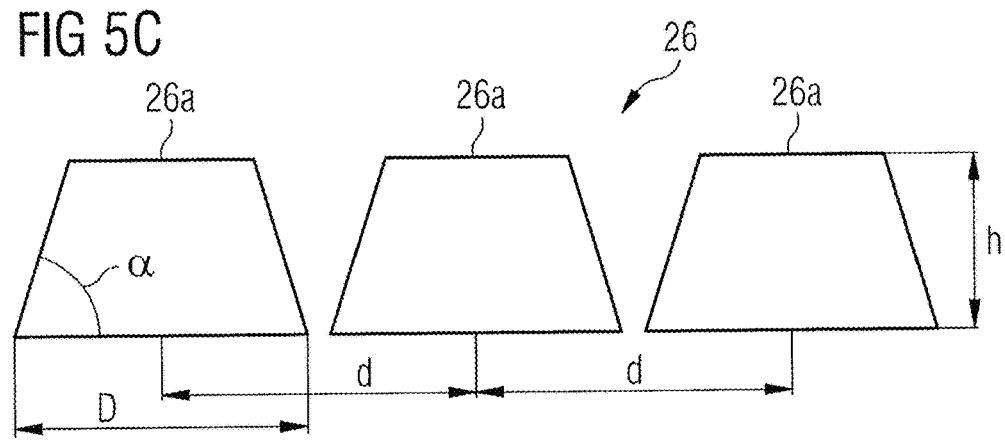
Figure 5D:
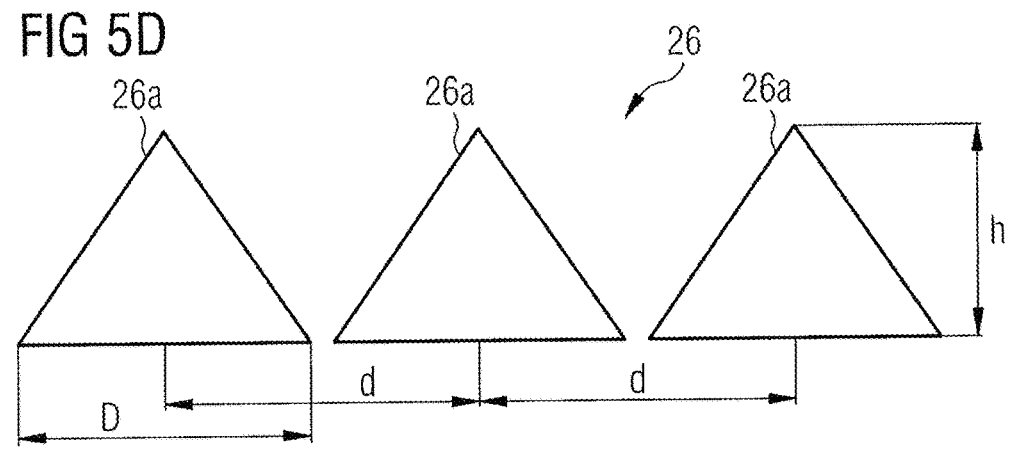

FIG. 5C shows a version of the structures 26a and 27a as truncated cones or truncated pyramids. For example, if the structures 26a and 27a are truncated cones having a diameter D of 400 nm and a height h of 160 nm as well as a cone angle $\alpha$ of 75 degrees, by arranging the structures 26 and 27 in a two-dimensional hexagonal close packed manner, roughly a doubling of the base area can be achieved since, in addition to the base area of the truncated cone, its lateral surface also contributes to the contact area 28.

In addition to the structures 26a and 27a shown in FIGS. 5A to 5D, the inverse structures can also be used as depressions or recesses in the semiconductor body.

In particular, the structures 26a as well as the further structures 27a can be produced by etching. The etching can be carried out with the help of a mask using a photolithographic process and natural lithography.

Due to the structures 26a, in addition to an enlarged contact area 28 for dissipating heat, there is also an enlarged electrical contact area in the emitter region 5, which lowers the electrical resistance for contacting. A further advantage of the application of the structurings 26 and the further structurings 27 is that, without the need to change the general construction of the semiconductor laser diodes, the structuring can be applied to already existing component species of semiconductor laser diodes. This means that the proposed procedures for reducing the thermal lens can be applied to semiconductor laser diodes that have already been produced so that they can be implemented particularly quickly and cost-effectively.

Figure 6A:
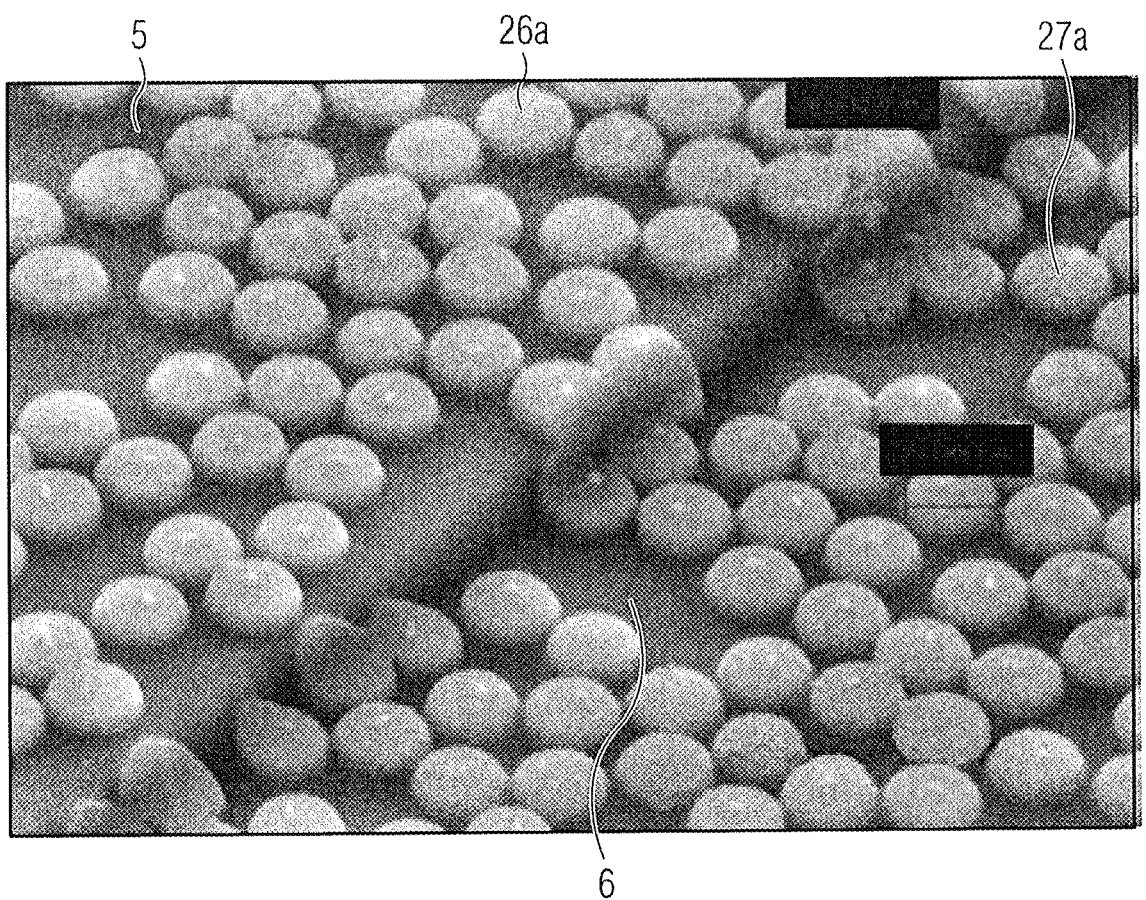
FIGS. 6A and 6B show schematic views of intermediate products of the examples of semiconductor laser diodes.
Figure 6B:
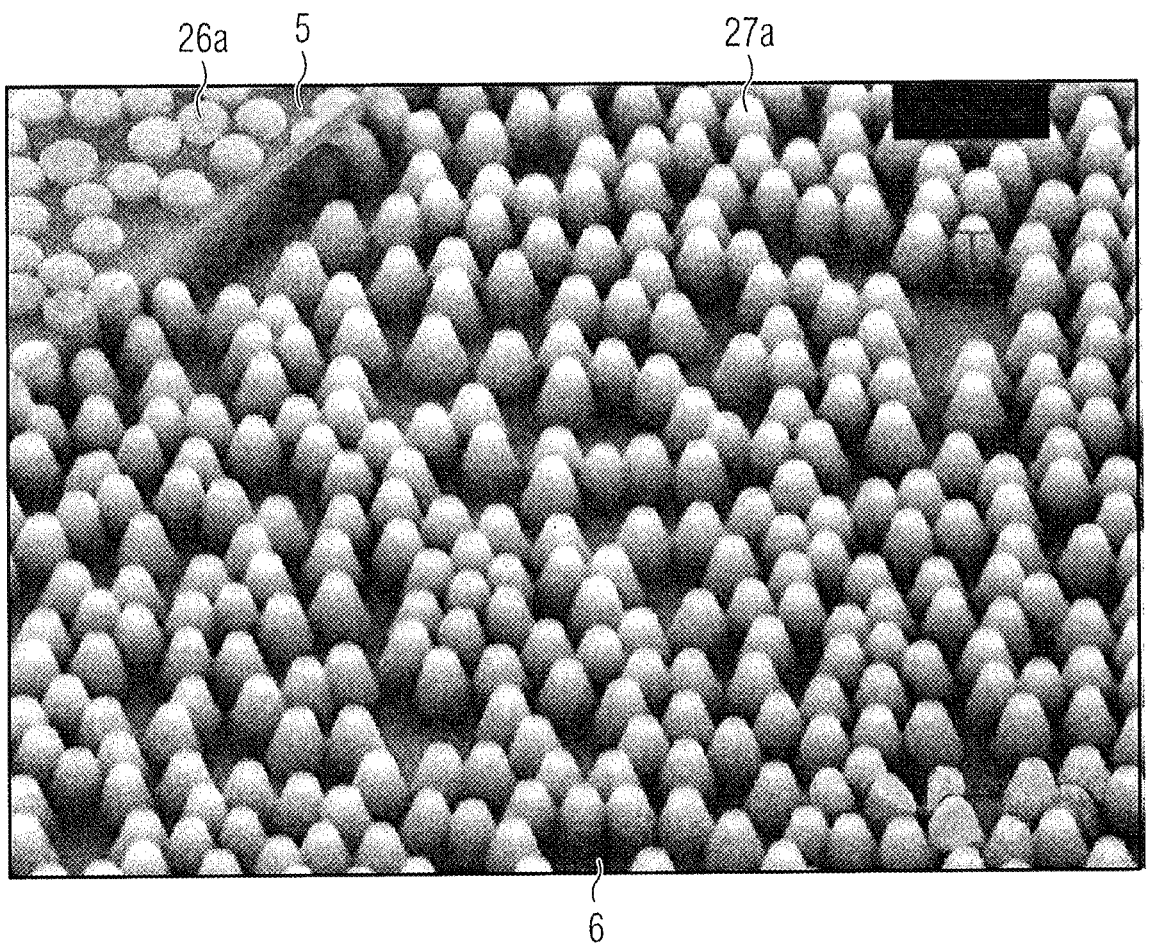

The schematic top views in FIGS. 6A and 6B show excerpts of an intermediate product of the examples of my semiconductor laser diodes. In the figures, the emitter region 5 as well as a subregion 6 are shown in extracts. The structures 26a are located in the emitter region 5 and the further structures 27a are located in the subregion 6. According to the example shown in FIG. 6A, the structural form as well as the structural sizes are the same. According to the example in FIG. 6B, the further structures 27a are selected to have a greater height h than the structures 26a. The structures 27a are particularly suitable for weakening the secondary modes, whereas the structures 26a are formed to be so flat that they do not pierce the connection region 24 of the semiconductor laser diode.

In the emitter region 5, the structurings 26a are subsequently covered with a metallization, which is part of the first connection element 3. In the subregion 6, the further structures 27a are covered with an electrically insulating material of the insulation element 8.

Overall, the semiconductor laser diodes are characterized by particularly good heat dissipation in the emitter region 5 of the semiconductor body 2, wherein the heat dissipation can be improved especially in the region of the radiation exit surface 7, i.e. in the region of the light exit facet. In this way, the effects of the thermal lens are reduced, resulting in a semiconductor laser diode having an improved beam quality and an increased efficiency in generating laser radiation.

My laser diodes are not restricted to the examples by the descriptions thereof made with reference to the examples. This disclosure rather comprises any novel feature and any combination of features, including in particular any combination of features in the appended claims, even if the feature or combination is not itself explicitly indicated in the claims or examples.

Priority of DE 102016110790.5 is claimed, the subject matter of which is incorporated herein by reference.

The invention claimed is:

1. A semiconductor laser diode comprising:
a semiconductor body having an emitter region; and
a first connection element that electrically contacts the semiconductor body in the emitter region, the first connection element comprises a metallic layer,
wherein
the semiconductor body is in contact with the first connection element in the emitter region,
at least in places in the emitter region, the semiconductor body has a structuring that enlarges a contact area between the semiconductor body and the first connection element,
the structuring has a density of structures and the density of the structures increases toward a radiation exit surface,
the structuring comprises a plurality of structures, and
the closer the structures are to the radiation exit surface, the smaller a distance (d) is between neighboring structures.

2. The semiconductor laser diode according to claim 1, wherein
the structuring has a density of structures, wherein the density of the structures increases towards a radiation exit surface,
the semiconductor body comprises a subregion arranged laterally adjacent to the emitter region,
at least in places in the subregion, the semiconductor body has a further structuring comprising further structures, wherein the further structuring is configured to weaken secondary modes, and
the structures of the structuring have a mean height (h) that is smaller than a mean height (h) of the further structures of the further structuring.

3. The semiconductor laser diode according to claim 2, wherein the further structures are etched.

4. The semiconductor laser diode according to claim 1, wherein at least in places, the contact area having the structuring located between the semiconductor body and the first connection element is at least 1.5 times as large as a contact area free of any structuring and located between the semiconductor body and the connection element.

5. The semiconductor laser diode according to claim 1, wherein the connection layer comprising the metallic layer completely covers the semiconductor body in the emitter region.

6. The semiconductor laser diode according to claim 1, wherein at least in places, the structuring comprises at least one structure selected from the group consisting of truncated cone, inverse truncated cone, truncated pyramid, inverse truncated pyramid, cone, inverse cone, pyramid, inverse pyramid, spherical shell and inverse spherical shell.

7. The semiconductor laser diode according to claim 1, wherein a maximum lateral extension of each of the structures is at least 400 nm.

8. The semiconductor laser diode according to claim 1, wherein, in the emitter region, the semiconductor body comprises a connection region directly adjoining the first connection element at the contact area, and the connection region is not completely pierced at any point.

9. The semiconductor laser diode according to claim 1, wherein the semiconductor body comprises a subregion arranged laterally adjacent to the emitter region, and at least in places in the subregion, the semiconductor body has a further structuring comprising further structures, said further structuring being configured to weaken secondary modes.

10. The semiconductor laser diode according to claim 9, wherein an electrically insulating insulation element is arranged between the subregion and the first connection element and in the subregion completely covers the semiconductor body on its side facing the first connection element.

11. The semiconductor laser diode according to claim 9, wherein the structures of the structuring have a mean height (h) that is smaller than a mean height (h) of the further structures of the further structuring.

12. The semiconductor laser diode according to claim 1, wherein the structures are etched.

13. A semiconductor laser diode comprising:
a semiconductor body having an emitter region; and
a first connection element that electrically contacts the semiconductor body in the emitter region, the first connection element comprises a metallic layer,
wherein
the semiconductor body is in contact with the first connection element in the emitter region, at least in places in the emitter region, the semiconductor body has a structuring that enlarges a contact area between the semiconductor body and the first connection element, and the structuring has a density of structures and the density of the structures increases toward a radiation exit surface.

* * * * *